CONDENSED VAPOR PHASE PHOTOETCHING OF SURFACES
Filed May 29, 1967
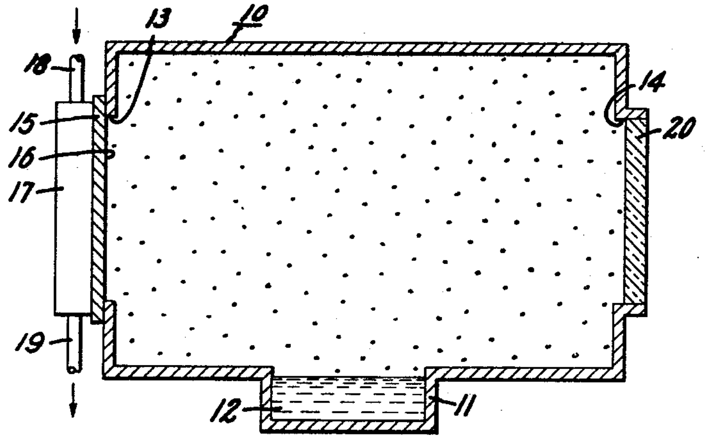
Inventor:
Donald L. Schaefer,
by John M. Davis
His Attorney.

United States Patent Office 3,494,768
Patented Feb. 10, 1970

3,494,768

CONDENSED VAPOR PHASE PHOTOETCHING OF SURFACES

Donald L. Schaefer, Schenectady, N.Y., assignor to General Electric Company, a corporation of New York Filed May 29, 1967, Ser. No. 641,901
Int. Cl. C23f *1/00;* C23b *3/00;* G03c *5/16*
U.S. Cl. 96—36 4 Claims

ABSTRACT OF THE DISCLOSURE

A process and apparatus is disclosed whereby a surface to be etched is exposed to a vapor of an etchant which in the condensed liquid form is photolytically decomposable to form chemically reactive species which attack and etch the surface. Means are provided for cooling the surface so that a thin film of the etchant is formed on the surface which is simultaneously exposed to a pattern of the activating radiation, whereby the liquid etchant is photolytically decomposed at the illuminated areas and the surface is selectively etched in those areas to form an etched image having point-to-point correspondence to the radiation pattern. As the liquid film becomes depleted of the reactive constituent it is constantly replenished by condensation of the vapor.

The invention herein described was made in the course of performance under a contract with the Bureau of Ships, U.S. Navy Department.

It should be noted at this point that the photo-etching of metallic materials have been disclosed and claimed in the copending applications Ser. No. 275,753, Gaynor, filed Apr. 25, 1963, now U.S. Patent 3,346,384, entitled "Metal Image Formation"; Ser. No. 604,541, Schaefer and Burgess, filed Dec. 27, 1966, entitled "Photolytic Etching of Gold," and the photoetching of silicon dioxide utilizing liquid reactants are disclosed in Ser. No. 642,159, Schaefer, filed concurrently herewith, entitled "Photolytic Etching of Silicon Dioxide," and Ser. No. 642,201, Schaefer, filed concurrently herewith and entitled "Etching of Silicon Dioxide by Photosensitive Solutions," all assigned to the assignee of the present application.

BACKGROUND OF THE INVENTION

As is well-known, it is frequency desired to etch patterns of various kinds in the surfaces of bodies of various materials for decorative as well as utilitarian purposes in a reproducible manner. For example, repetitively reproducible decorative designs are commonly etched into the surfaces of metallic jewelry items, supported metal films, art objects, glassware and "crystal" glass. Utilitarian designs are commonly etched into metallic surfaces for use in, for example, the printing arts, into metallic films supported upon dielectric or semiconductive substrates in the electrical or electronic arts for use as "printed circuit" elements, and in silicon dioxide films supported by silicon chips useful in the so-called "integrated circuit" art. It will thus be appreciated that the problems associated with the etching of such patterns are not confined to the etching of surfaces of relatively thin films supported by a substrate of a different material, but are also common to the etching of surfaces of homogeneous bodies which are self-supporting.

One of the most widely used techniques for etching patterns or images in or on surfaces is the so-called "photoresist" process. This technique involves the use of a film-forming liquid which is or contains a photosensitive material which reacts to light to form an insoluble product. More specifically, a thin film of the photoresist material is applied to the surface to be etched, dried to form a continuous solid film, and exposed to a pattern of activating radiation, usually through a photographic transparency. The light struck areas of the photoresist film are converted to an insoluble form, usually by a photopolymerization reaction or by photo-induced cross-linking, for example, while those areas which were not exposed are unchanged. The film covered surface is then exposed to a solvent which dissolves and removes the non-exposed, soluble portions of the film and leaves behind the light struck areas of the film which are insoluble in the solvent used in the form of a pattern or mask having a point-to-point correspondence to the projected light pattern or image. Those portions of the surface to be etched which are unprotected by the pattern or mask of the photoresist material are then exposed to an etchant such as a mineral acid, or any other material effective to etch the material comprising the surface whereby a corresponding image is etched into the surface. After the etching step is completed, it is conventional to wash the remaining etchant and reaction products from the surface and to remove the mask of photoresist material. It will of course be appreciated that the photoresist mask must not be appreciably attached by the etchant employed.

It will be further appreciated that this process has several inherent disadvantages. As previously pointed out, the photolytic reaction of the photoresist materials usually involves a polymerization or cross-linking type of reaction and the edge resolution between reacted and unreacted zones is frequently of uncertain quality and may be difficult to reproduce with any degree of consistency from one part to another. Considerable care must be exercised during the washing step and the etching step to prevent portions of the insoluble photoresist pattern from lifting. Undercutting of the insoluble pattern by the etchant is unavoidable and virtually impossible to accurately control which, in the production of electrical elements, introduces variations in the electrical characteristics of each element for which external compensation may be necessary. Usually the etchants employed are extremely hazardous. In the manufacture of printed circuits by this method which involves the etching of an electrically conductive metal film supported on a dielectric substrate to form a pattern of the electrically conductive paths, the only way in which the conductivity or resistivity of a given current carrying path may be controlled is by varying the width of the path since the thickness of the metal film is constant. Further, great care must be employed in removing the insoluble photoresist mask to avoid damaging the etched pattern. It would be advantageous to eliminate the necessity for the use of the photoresist material and the multiple step process attendant therewith and the use of these hazardous etchant materials.

It is therefore a principal object of this invention to provide a process for etching predetermined patterns in surfaces which does not require the use of a mask or highly toxic or corrosive etchants.

A further object of this invention is the provision of an apparatus for the selective etching of a surface wherein the etching is photolytically controlled.

Other and specifically different objects of the invention will become apparent to those skilled in the art from the following disclosure.

SUMMARY OF THE INVENTION

Briefly stated, this invention provides a method and apparatus for the selective etching of surfaces by contacting the surface with the vapor of a liquid composed of a photodecomposable material which is nominally inert with respect to the material of the surface, cooling said surface to cause a thin film of said liquid to condense on said surface and simultaneously exposing said surface to a pattern or image of activating radiation whereby said liquid is photolytically decomposed to form species which are chemically reactive with the surface to etch the surface in the illuminated areas to produce a pattern in said surface which has a point-to-point correspondence to the pattern of activating radiation and at a rate which is dependent at least in part upon the intensity of the radiation at any given point on the interface.

The invention and the manner in which it may be practiced may be better understood from the following description taken in conjunction with the accompanying drawing in which an exemplary apparatus is shown in semi-schematic form as a vertical section with parts broken away for greater clarity of illustration.

DESCRIPTION OF THE PREFERRED EMBODIMENTS

More particularly, and with reference to the exemplary apparatus shown in the accompanying drawing, a chamber 10 is provided having reservoir 11 for containing a supply of a liquid 12 therein. An opening or aperture 13 is provided at one end of chamber 10 and an aperture 14 is provided at the opposite end of the chamber. Aperture 13 is closed by means of a removable body 15 having a surface 16 comprising the surface to be etched. Cooling means which may comprise a water jacket 17 in heat exchange relationship with the side of body 15 opposite to the side 16 is conveniently provided with a source of cooling water through conduit 18 and an outlet conduit 19. Aperture 14 is provided with a window member 20 which is transparent to activating radiation and may be composed of quartz, for example. In operation, reservoir 11 and the side walls of the chamber 10 including window 20 are maintained at an elevated temperature by any suitable conventional heating means so that the liquid 12 is maintained at a temperature slightly above its boiling point so that the interior of the chamber 10 is filled with vapor. Under certain conditions, depending upon the nature of the surface to be etched and the liquid, used, the interior of the chamber may be initially flushed with an inert gas such as nitrogen, for example, and a small amount of water or water vapor introduced therein. It will be appreciated that the initial pressure within the chamber may be reduced below atmospheric pressure if desired.

As a specific example, body 15 is composed of a silicon wafer having a surface 16 composed of silicon dioxide. Liquid 12 in reservoir 11 may be 1-fluoro-2-propanol. As disclosed in copending application Ser. No. 642,201, previously referenced, thin films of 1-fluoro-2-propanol in contact with silicon dioxide surfaces may be photolytically decomposed by suitable activating radiation projected through the film to produce chemically reactive species which attack the silicon dioxide at the liquid to solid interface to produce etching in the illuminated areas of the interface. If the liquid film is thicker than about 5 millimeters, etching becomes ineffective presumably because the reactive species are destroyed by recombination or competing side reactions before they can reach the interface. Very thin liquid films are desirable and a continuous supply of the etching liquid is desirable.

The interior temperature of the chamber 10 is raised until it is filled with 1-fluoro-2-propanol vapor. The specific temperature employed is a function of the initial pressure within the chamber. Heat is also applied to window 20 to prevent condensation of the vapor thereupon. Silicon body 15 is cooled by heat exchanger 17 to reduce the temperature of the silicon dioxide surface 16 to a point below the dew point temperature of the vapor so that a thin film of liquid 1-fluoro-2-propanol is deposited thereon.

As has previously been pointed out, a very thin liquid film is desired so that maximum efficiency of etching is achieved. Therefore, the temperature of the surface 16 is to be adjusted by the heat exchanger 17 relative to the dew point of the vapor so that an equilibrium between the liquid phase and the vapor phase is established so that the liquid film thickness is controlled to produce a very thin physically stable continuous liquid film. Simultaneously an image pattern of activating radiation is projected upon the thin film of condensed liquid on surface 16 through window 20 by means of conventional projection apparatus, not shown. A source of illumination which is suitable may be from a 1000 watt high pressure mercury lamp. Since the vapor is essentially transparent to the radiation, virtually no absorption of the radiation occurs until the liquid film is encountered, whereupon the liquid is photolytically decomposed to form chemically reactive species at the silicon dioxide-liquid interface causing etching to take place in the illuminated areas thereof. In this particular system, one of the products of the etching reaction is $SiF_4$, a gas which readily leaves the interface, and another is acetone which has a boiling point less than 1-fluoro-2-propanol and hence is readily removed from the interface by evaporation. The chemically reactive species produced by the photolytic decomposition of the liquid disappear from the liquid in the absence of radiation in extremely short periods of time either through recombination or competing side reactions so that there is virtually no migration of these species from illuminated areas to non-illuminated areas to provide significant etching in areas which are not irradiated. Also, the inherent immobility of very thin liquid films due to boundary layer effects prevents migration.

From the foregoing, it will be apparent that an etching technique has been provided wherein a substantially infinitely thin film of etchant may be applied to the surface to be etched with a substantially infinite supply of the active etching ingredient.

While the foregoing specific example has disclosed 1-fluoro-2-propanol as an etchant for silicon dioxide surfaces, obviously other photo decomposable fluorine containing liquids may be used. For example, fluorobenzene having a boiling point of about 85° C. may be employed, as well as others. Additionally, the surface to be etched need not be confined to silicon dioxide. For example, a surface 16 composed of gold may be etched by a photolytically decomposed liquid bromine compound such as carbon tetrabromide in the presence of a partial pressure of methanol. Obviously, other materials may be similarly etched by appropriate photolytically reactive materials. It should also be observed that if the body 15 whose surface 16 is to be etched is composed of a material which is transparent to the activating radiation, such as, for example, fused quartz, the interface between the liquid film and surface 16 may be illuminated through the body 15 and other suitable cooling means such as a jet of cold air blown upon or across the outer surface of the body 15 may be substituted for the heat exchange means 17, 18 and 19.

From all the foregoing, it will be apparent to those skilled in the art that an apparatus and method have been provided by this invention whereby image patterns of activating radiation may be projected upon an interface formed between a surface to be etched and a very thin liquid film of a reagent which is photolytically decomposable by the radiation to form chemically reactive species which attack the surface to cause etching to occur in the illuminated areas thereof at a rate which is proportional to the intensity of the illumination, and that the thin liquid film is continuously replenished permitting substantially continuous etching to take place, whereby the depth of the etched pattern is not limited to any particular dimension. While certain particular embodiments have been disclosed for purposes of illustration, various modifications thereof will be readily apparent to those skilled in the art and therefore it is not intended that the invention be limited in any way except as defined by the appended claims. For example, in the apparatus illustrated, the surface to be etched has been shown as vertically disposed. Obviously, it could be horizontally arranged if desired by a simple rearrangement of the various components of the apparatus.

What I claim as new and desire to secure by Letters Patent of the United States is:

1. A method of etching a silicon dioxide surface of a solid body of material, comprising the steps of exposing said surface to a condensible vapor, cooling said surface to a temperature below the dew point of said vapor to form a thin liquid film thereon, said liquid comprising a fluorine compound which is photolytically decomposable to form chemically reactive species which attack and etch said silicon dioxide surface when exposed to activating radiation, said compound taken from the group consisting of 1-fluoro-2-propanol and fluorobenzene, and exposing at least a portion of the interface between said liquid film and said surface to activating radiation to cause the formation of said chemically reactive species and etch said silicon dioxide surface in the illuminated areas.

2. The method set forth in claim 1 wherein said liquid film is condensed from vaporized 1-fluoro-2-propanol.

3. The method set forth in claim 1 wherein said liquid film is condensed from vaporized fluorobenzene.

4. The method set forth in claim 1 wherein said body is composed of elemental silicon.

References Cited

UNITED STATES PATENTS

| | | | |
|---|---|---|---|
| 2,804,388 | 8/1957 | Marrod et al. | 96—36 X |
| 2,841,477 | 7/1958 | Hall | 204—157.1 X |
| 2,875,046 | 2/1959 | Marrod et al. | 96—36 X |
| 3,095,332 | 6/1963 | Ligenza | 156—17 X |
| 3,095,341 | 6/1963 | Ligenza | 156—17 |
| 3,122,463 | 2/1964 | Ligenza et al. | 156—4 |
| 3,271,180 | 9/1966 | White | 96—36 X |
| 3,346,384 | 10/1967 | Gaynor | 90—36 |

GEORGE F. LESMES, Primary Examiner

R. E. MARTIN, Assistant Examiner

U.S. Cl. X.R.

96—36.2; 156—4, 17